United States Patent [19]

Botez

[11] Patent Number: 4,523,317
[45] Date of Patent: Jun. 11, 1985

[54] SEMICONDUCTOR LASER WITH REDUCED ABSORPTION AT A MIRROR FACET

[75] Inventor: Dan Botez, Mount Holly, N.J.
[73] Assignee: RCA Corporation, Princeton, N.J.
[21] Appl. No.: 437,839
[22] Filed: Oct. 29, 1982
[51] Int. Cl.³ .................................................. H01S 3/19
[52] U.S. Cl. ........................................ 372/45; 357/17; 372/48
[58] Field of Search .................... 372/44, 45, 46, 48, 372/49; 357/17, 55, 56

[56] References Cited

U.S. PATENT DOCUMENTS

| | | | |
|---|---|---|---|
| 3,753,801 | 8/1973 | Lockwood et al. | 148/171 |
| 3,978,426 | 8/1976 | Logan et al. | 331/94.5 H |
| 3,993,963 | 11/1976 | Logan et al. | 331/94.5 H |
| 4,178,564 | 12/1979 | Ladany et al. | 331/94.5 H |
| 4,215,319 | 7/1980 | Botez | 331/94.5 H |
| 4,347,486 | 8/1982 | Botez | 372/46 |
| 4,371,966 | 2/1983 | Scifres et al. | 372/46 |

OTHER PUBLICATIONS

N. Ueno, "Optimum Design Conditions for AlGaAs Window Stripe Lasers", *IEEE Journal of Quantum Electronics*, QE17, 2113, (1981).

*Primary Examiner*—James W. Davie
*Attorney, Agent, or Firm*—Birgit E. Morris; Donald S. Cohen; William J. Burke

[57] ABSTRACT

A semiconductor laser having an active layer which has a non-zero thickness in a region adjacent to at least one of the mirror facets which is less than that of the remainder of the active layer in the longitudinal direction. In the region adjacent to the mirror facet the laser light propagates primarily in a non-absorbing guide layer adjacent to the active layer thus, reducing optical absorption and heat generation at the mirror facet.

8 Claims, 9 Drawing Figures

SEMICONDUCTOR LASER WITH REDUCED ABSORPTION AT A MIRROR FACET

The U.S. Government has rights in this invention pursuant to a government contract.

The invention relates to a semiconductor laser having an active layer which tapers in decreasing thickness to a mirror facet.

BACKGROUND OF THE INVENTION

A semiconductor laser typically comprises a body of semiconductor material, generally Group III–V compounds and alloys of such compounds, having a thin active layer between layers of opposite conductivity type. Constricted heterostructure semiconductor lasers, such as those disclosed by Botez in U.S. Pat. No. 4,347,486 and by Connolly et al in U.S. Pat. No. 4,461,008 and entitled, TERRACED HETEROSTRUCTURE SEMICONDUCTOR LASER, which are incorporated herein by reference, are capable of producing a single transverse (the direction perpendicular to the plane of the layers) and lateral (the direction in the plane of the layers and perpendicular to the direction of light propagation) mode, high-power laser beam. Light generated in the active layer of such devices is coupled into an adjacent guide layer and propagates in the active and the guide layer, thereby producing a much larger mirror facet area from which light is emitted. While the emitting area is larger than that for the conventional laser, this area is still typically only on the order of several square micrometers ($\mu$m) at the mirror facet. The local power density is thus high and may result in damage to the mirror facet. To avoid facet damage the laser output power density at the facet is held below the threshold at which such damage occurs. In addition a transparent coating, such as that disclosed by Ladany et al. in U.S. Pat. No. 4,178,564, incorporated herein by reference, may be placed on the emitting facet to increase the threshold at which the damage occurs. This combination of measures reduces the incidence of facet damage but at the price of limiting the maximum output power of the laser to less than its inherent capability.

It has been suggested that catastrophic damage is caused by local heating of the facet to its melting temperature due to absorption of the laser light. To reduce or eliminate this effect, semiconductor lasers have been fabricated in which the light absorbing active layer of the device does not extend to the facets. The regions between the ends of the active layer and the facets are formed of a light transmissive material, thereby eliminating the problem of absorption at the facets. Such devices have shown a significant increase in the threshold powers at which long term and catastrophic damage occur of between about five and ten times.

Such devices do not, however, provide lateral mode control, particularly in the region adjacent to the facets and they require a two-step growth procedure with an intervening etching step. It would be desirable to have a constricted heterostructure semiconductor laser having lateral mode control extending to a non-absorbing mirror as well as to fabricate the laser in a one step growth process.

SUMMARY OF THE INVENTION

The invention is a laser comprising a semiconductor body having parallel mirror facets and including a substrate having a pair of channels in a surface thereof with a mesa therebetween. A first confinement layer overlies the surface of the substrate, the channels and the mesa. An active region comprising an active layer and an adjacent guide layer overlies the first confinement layer and a second confinement layer overlies the active region. The active layer has a smaller non-zero thickness over the mesa in a region adjacent to at least one of the mirror facets than over the remainder of the mesa.

DETAILED DESCRIPTION OF PREFERRED EMBODIMENTS

Figure 1:
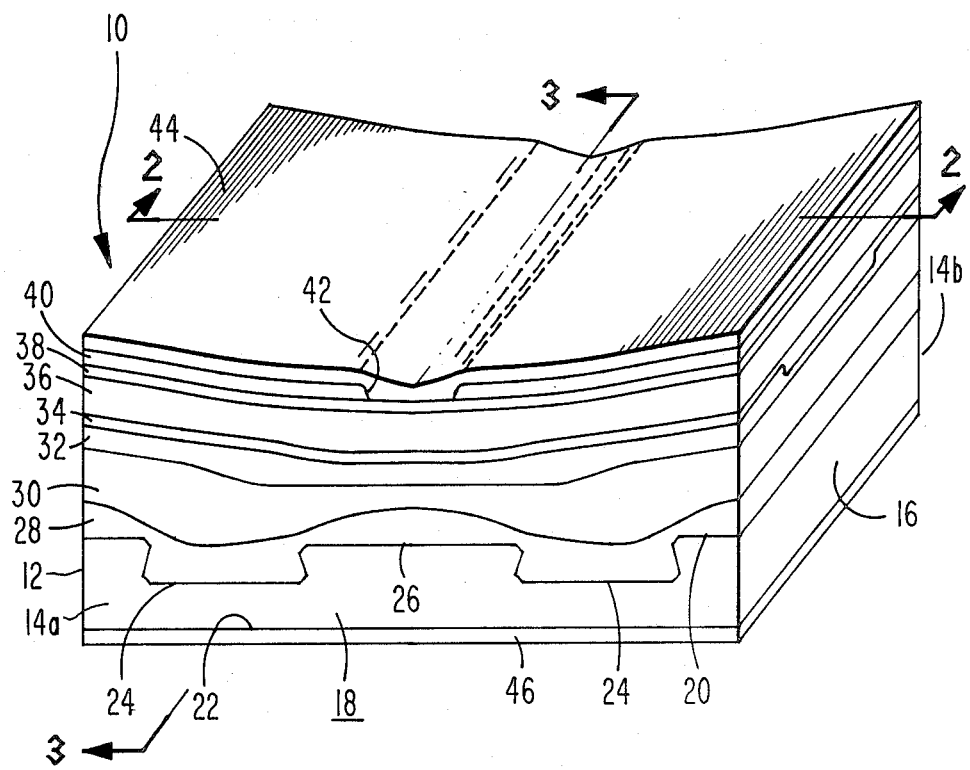
FIG. 1 is a perspective view of a semiconductor laser of the invention.

In FIG. 1 the semiconductor laser 10 is shown to include a body 12 of single crystal semiconductor material in the form of a parallelopiped. The body 12 has spaced, parallel mirror facets 14(a) and 14(b) which are partially reflecting of light with at least one of the facets being partially transparent so that light may be emitted therefrom. The body 12 also includes spaced, parallel side surfaces 16 which extend between and are perpendicular to the facets 14(a) and 14(b).

The semiconductor body 12 includes a substrate 18 having spaced, parallel, first and second major surfaces 20 and 22, respectively, which extend between and are perpendicular to both the facets 14(a) and 14(b) and the side surface 16. In the first major surface 20 a pair of spaced channels 24 extend between the facets 14(a) and 14(b) with a mesa 26 therebetween. A buffer layer 28 overlies the first major surface 20 and the mesa 26 and partially fills the channels 24. A first confinement layer 30 overlies the buffer layer 28 and a guide layer 32 overlies the first confinement layer 30. An active layer 34 overlies the guide layer and a second confinement layer 36 overlies the active layer 34. A capping layer 38 overlies the second confinement layer 36 and an electrically insulating layer 40 overlies the capping layer 38 and has an opening 42 extending therethrough. A first electrical contact 44 overlies the electrically insulating layer 40 and the capping layer 38 in the region of the opening 42. A second electrical contact 46 overlies the second major surface 22.

The combination of the active layer 34 and the adjacent guide layer 32 forms the active region of the laser.

In the remaining FIGURES, the identification of those elements which are common to FIG. 1, are the same.

Figure 2:
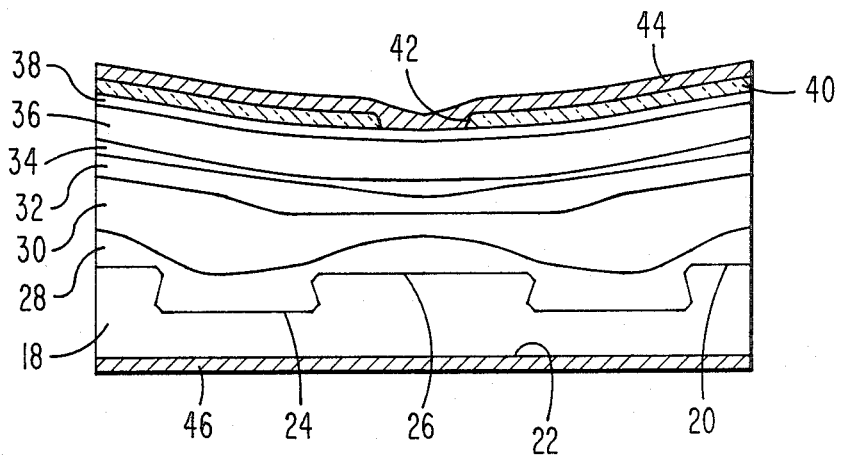
FIG. 2 is a cross-sectional view along the line 2—2 of FIG. 1.
Figure 3:
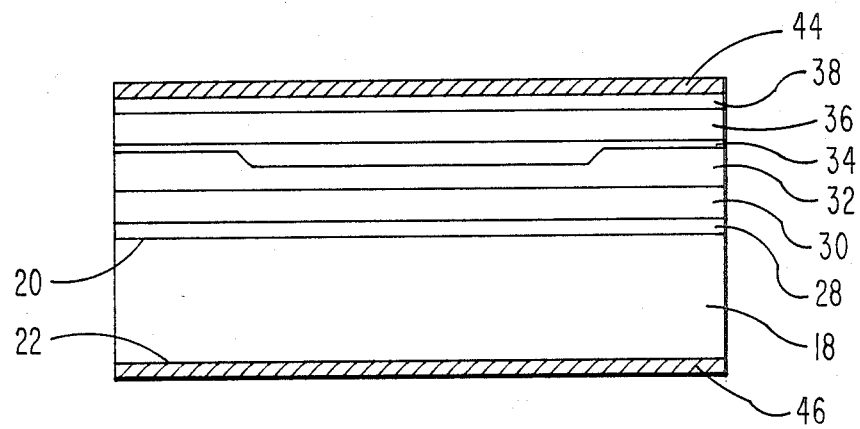
FIG. 3 is a cross-sectional view of the laser of FIG. 1 along the line 3—3.

FIGS. 2 and 3 are cross-sectional views of the laser 10 along the lines 2—2 and 3—3, respectively, of FIG. 1. Comparison of FIGS. 2 and 3 with FIG. 1 shows that the shape of the guide layer 32 and the active layer 34 differ in that the thickness of the active layer 34 over the mesa 26 is greater in the center of the laser 10 than at the mirror facets 14(a) and 14(b). This difference in thickness defines a lasing region I which has a thicker active layer 34 and a non-lasing region II which has a thinner active layer 34 as shown in FIG. 3.

The various layers may be deposited sequentially on the substrate 18 using the well known techniques of liquid phase epitaxy such as described by Botez in U.S. Pat. No. 4,215,319 and by H. F. Lockwood et al. in U.S. Pat. No. 3,753,801, both of which are incorporated herein by reference. In liquid phase epitaxy the local growth rate of a portion of an individual layer will vary with the local curvature of the surface upon which it is grown. The greater the amount of local positive curvature of the surface, when viewed from the direction of the overlying layers, the higher the local growth rate will be. For example, the first confinement layer 30 may be grown to a thickness such that the surface upon which the guide layer 32 is deposited has a local depression over the mesa 26. The guide layer 32 will then have a higher local growth rate over those portions of the first confinement layer 30 having the greatest positive curvature, that is, the concave portions of the surface. The top surface of the guide layer 32 will have a concave shape centered over the mesa 26. The growth rate of the active layer 32 over the guide layer will then be higher over the mesa 26 than over the channel 24, resulting in an active layer 34 which is thickest over the mesa 26 and tapers in decreasing thickness in the lateral direction.

Figure 4:
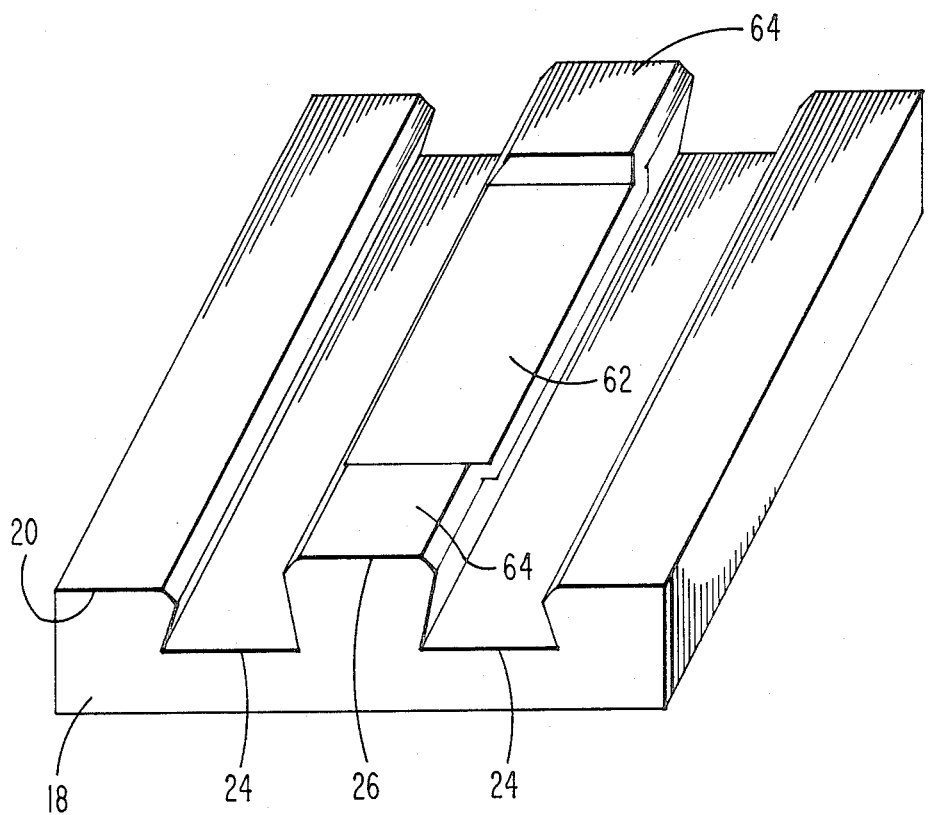
FIGS. 4–6 are perspective views of three different channel structures in the substrate surface.
Figure 5:
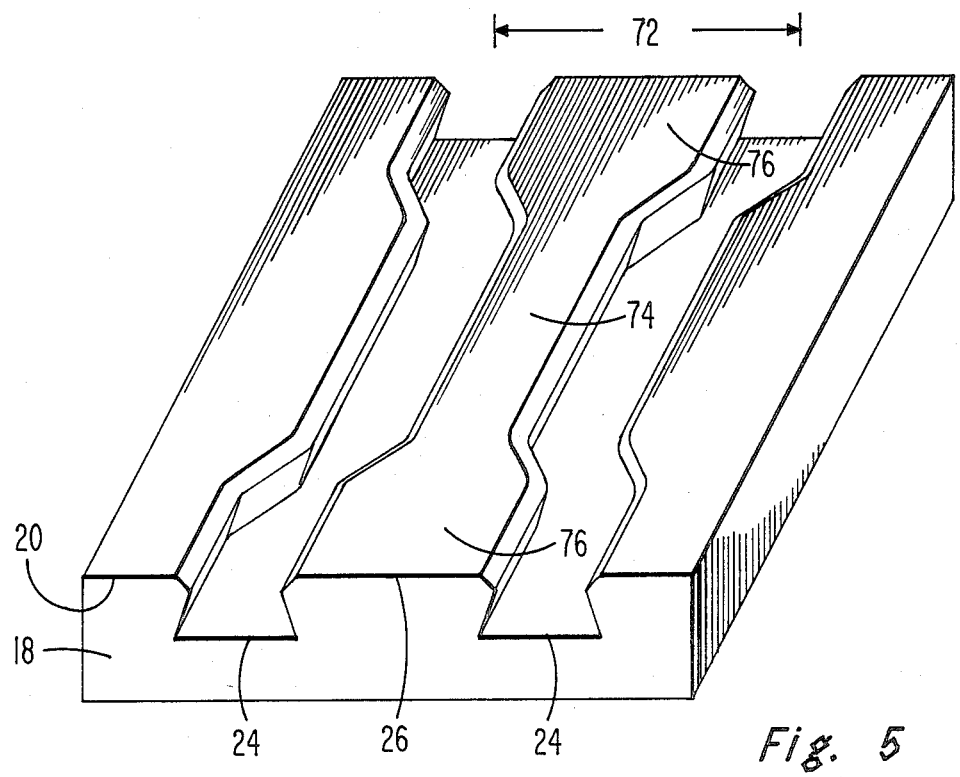
Figure 6:
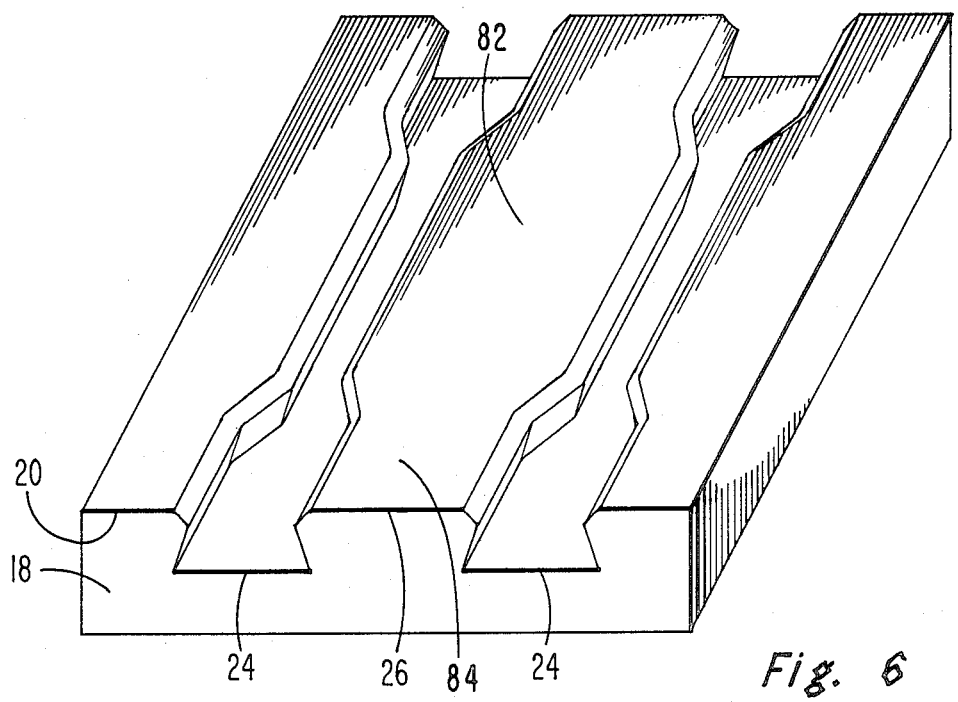

In FIGS. 4–6 three different approaches to obtaining a longitudinal (the direction between the mirror facets) as well as a lateral active layer thickness variation are shown. These approaches are based upon variations in the structure of the underlying channels in order to introduce locally varying growth conditions in the longitudinal as well as the lateral direction.

In FIG. 4 the substrate 18 is shown to have a pair of substantially parallel channels 24 in the major surface 20 with a mesa 26 therebetween. The height of the mesa above the bottom of the channels 24 is less at the center portion 62 of the mesa than at the end portions 64. At the center portion 62 the height of the mesa 26 above the bottom of the channels 24 is typically less than that of the major surface 20 as disclosed by Botez in U.S. Pat. No. 4,426,701 and incorporated herein by reference. The height of the mesa 26 at the end portions 64 is typically between about 1 and 4 micrometers ($\mu$m) higher than the height of the center portion 62. The channels 24 are typically between about 4 and 20 $\mu$m wide at the surface 20, preferably about 10 $\mu$m wide, and have a depth of about 4 $\mu$m relative to the surface 20.

In FIG. 5 the substrate 18 is shown to have a pair of channels 24 in the surface 20 thereof with a mesa 26 therebetween. The center-to-center spacing 72 of the channels in the center portion 74 of the surface 20 is less than the center-to-center spacing at the end portions 76 of the substrate 18. The center-to-center spacing of the channels 24 at the center portion 74 is between about 20 and 45 $\mu$m and is preferably about 32 $\mu$m. The center-to-center spacing at the end portion 76 is between about 30 and 60 $\mu$m and is preferably about 45 $\mu$m. The depth of the channels 24 relative to the surface 20 is typically about 4 $\mu$m and the channel width at the surface 20 is typically about 10 $\mu$m.

In FIG. 6 the substrate 18 is shown to have a pair of channels 24 in the surface 20 with a mesa 26 therebetween. The channels are substantially parallel but have a varying channel width. The channel width in the center portion 82 of the substrate is less than the channel width at the end portions 84 of the substrate 18. The channel width at the center portion 82 is between about 8 and 12 $\mu$m and is typically about 10 $\mu$m. The channel width at the end portions 84 is between about 12 and 20 $\mu$m.

Each of these substrate structures enables one to deposit onto the substrate all of the semiconductor layers in a single growth sequence, without the need for stopping the growth sequence, etching the layers and then regrowing as is typically required in the prior art to obtain non-absorbing regions at the mirror facets.

Figure 7A:
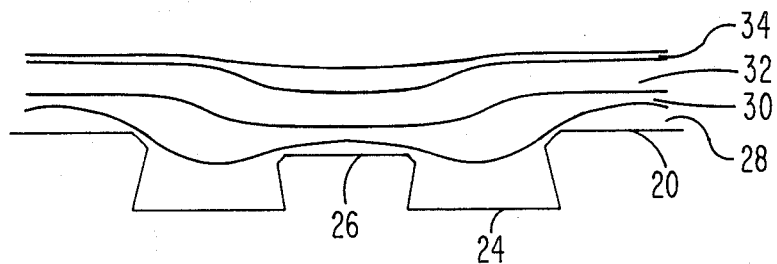
FIGS. 7(a) and 7(b) are schematic illustrations of how the active layer thickness varies with the variation in mesa height as shown in FIG. 4.
Figure 7B:
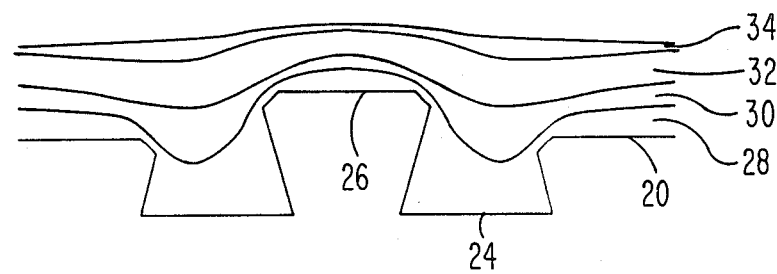

The shape and taper of the layers deposited on a substrate having a longitudinally varying mesa height is illustrated in FIG. 7(a) and 7(b) for low mesa and high mesa structures respectively. In FIG. 7(a) the mesa height is low, preferably less than that of the surrounding substrate surface 20. Deposition of the layers over the low mesa 26 results in a concave surface of the guide layer 32 upon which the active layer 34 is deposited. The active layer 34 then grows faster in the concave portion of the guide layer surface, producing a layer which is thicker over the mesa 26. In FIG. 7(b) the mesa 26 is shown to be higher than the surrounding surface 20 resulting in a convex surface of the guide layer 32 over the mesa 26 and concave surfaces over the adjacent channels 24. The active layer 34 will then grow more slowly over the mesa 26 thereby producing an active layer 34 which is thinner than that grown over the mesa 26 as shown in FIG. 7(a).

The key to producing a longitudinally varying active layer thickness in a single growth sequence is, then, that the channel structure in the substrate surface be such that the guide layer surface upon which the active layer is to be deposited have more negative curvature over the mesa where it is desired that the active layer be thinner. In FIG. 5 the wider mesa at the end portion 76 results in a flatter surface upon which the local growth rate is slower. It is to be understood that this embodiment also includes the configuration where the channels end before reaching the substrate edge, corresponding to an infinite center-to-center channel spacing. In FIG. 6 the greater channel width results in a more convex surface over the mesa which, again, will retard the growth of the active layer over the mesa.

The substrate 18 is typically composed of a binary III–V compound, preferably N-type GaAs, having a major surface 20 which may be parallel to or, preferably, misoriented from a {100} crystallographic plane with the axis of the channels oriented parallel to a <110> crystallographic direction. The use of the <110> family of crystallographic directions is preferred since the facets 14(a) and 14(b) of the semiconductor body 12 are then cleavage planes. The misorientation direction may be along the axis of the channels or it may be at an angle to this axis. The misorientation angle of the substrate off the (001) plane is between about 5° and 45°, and optimally 35°, to the [110] axis of the channels. The tilt angle of the major surface 20 with respect to the (001) plane is between about 0.2° and 1.5° and is preferably about 1.0° as disclosed by Connolly et al. in a U.S. patent application Ser. No. 437,840 entitled, SEMICONDUCTOR LASER HAVING HIGH MANUFACTURING YIELD filed concurrently herewith and incorporated herein by reference.

The channels 24 are shown as having a dove-tail shape which results from the channel axis being parallel to the [110] crystallographic direction. Alternatively, the channels may have a different shape, for example, a U, vee or rectangular shape which results when a different crystallographic axis or a different chemical etchant is used. The methods used to form the channels are those disclosed by Botez in U.S. Pat. No. 4,215,319.

The buffer layer 28 is typically composed of the same material as the substrate 18 and is typically between about 1 and 3 μm thick over the mesa 26. The first confinement layer 30 is typically composed of N-type $Al_wGa_{1-w}As$ where the fractional concentration w of Al is between about 0.25 and 0.4 and is typically about 0.35. This layer is typically between about 1 and 3 μm thick over the mesa 26. The guide layer is typically composed of N-type $Al_xGa_{1-x}As$ where the fractional concentration x of Al is less than that of the first confinement layer 30 and greater than that of the active layer 34 and is typically between about 0.1 and 0.3 and preferably about 0.2. The guide layer 32 typically has a thickness over the mesa 26 between about 0.5 and 2 μm. The active layer 34 is composed of $Al_yGa_{1-y}As$ where the fractional concentration y of Al is less than the concentration in the guide layer 32 and is typically between about 0 and about 0.07. Typically, this layer is between about 0.1 and 0.2 μm thick in the lasing region I and tapers in decreasing thickness in a longitudinal direction to a non-zero thickness in the non-lasing region II adjacent to one or both of the facets which is typically between about 0.02 and 0.1 μm. The thicker portion of the active layer 34 typically extends between about 100 and 200 μm and may extend to within between about 10 and 100 μm and preferably to within about 50 μm of the facets 14(a) and 14(b). The second confinement layer 36 is typically composed of P-type $Al_zGa_{1-z}As$ where the fraction concentration z of Al is between about 0.3 and 0.5 and is preferably about 0.4. This layer is typically between about 1 and 3 μm over the mesa 26. The capping layer 38 is typically between about 0.1 and 0.5 μm thick and is composed of P-type GaAs.

The conductivity types of the layers may be reversed so long as the relationship between the conductivity types of the individual layers is maintained.

The electrically insulating layer 40 is preferably composed of silicon dioxide which is deposited on the capping layer 38 by pyrolytic decomposition of silane in oxygen or water vapor. An opening is formed extending through the electrically insulating layer 40 down to the capping layer 38 over the mesa 26 using standard photolithographic mask techniques and chemical etching processes. The electrical contact 44 is deposited by vacuum evaporation over the electrically insulating layer 40 and the capping layer 38 in the region of the opening 40 and is preferably composed of titanium, platinum and gold sequentially deposited. The second electrical contact 46 may be formed by vacuum deposition and sintering of tin and gold.

Alternatively, the functions of the capping layer 38 and the electrically insulating layer 40 may be combined in a blocking layer of a semiconductor material, such as GaAs, having the opposite conductivity type to that of the second confinement layer 36. A portion of the blocking layer, typically in the form of a stripe, over the thickest portion of the active layer contains an excess concentration of a conductivity modifier which changes the conductivity type of the stripe portion to that of the second confinement layer. Application of a forward bias voltage between the electrical contacts will reverse bias the p-n junction between the blocking layer and the second confinement layer, thereby blocking current flow through the layer except in the region of the stripe.

The substrate 18, the buffer layer 28, the first confinement layer 30 and the guide layer 32 are of one conductivity type. The second confinement layer 36 and the capping layer 38 are of the opposite conductivity type. The active layer 34 may be of either conductivity type and is typically light conducting.

The refractive index at the laser wavelength of the active layer 34 is greater than that of the guide layer 32 which is greater than that of confinement layers 30 and 36.

Figure 8:
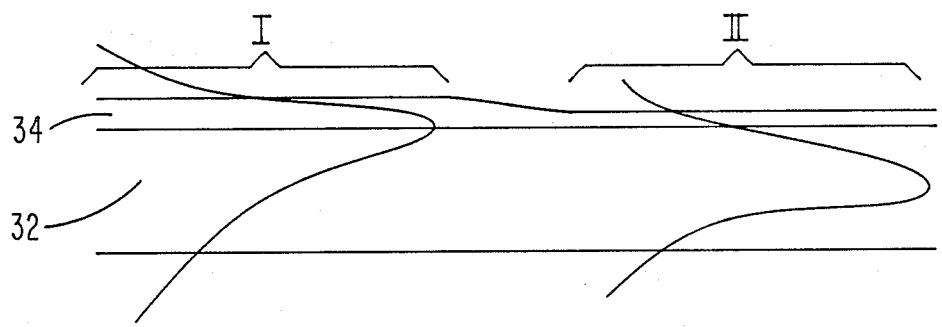
FIG. 8 is a schematic illustration of the optical intensity distributions in the lasing and non-lasing regions respectively.

In FIG. 8 the semiconductor laser of the invention is schematically shown as being composed of a lasing region I and a non-lasing region II. The difference in thickness of the active layer is such that the threshold for laser action in the non-lasing region II is much higher than that in the lasing region I. That is, laser action will occur in the thicker portion of the device corresponding to the lasing region I. Light beam propagation in the combination of the active and guide layers then is different in the lasing region I and the non-lasing regions II. The peak optical intensity in the lasing region I is located near the interface between the active layer 34 and guide layer 32 and a large fraction of the light propagates in the active layer. In the non-lasing region II, the peak optical intensity is in the guide layer 32 with only a small fraction of the optical field in the active layer 34. Thus, in the non-lasing region II adjacent to a mirror facet only a small fraction of light is located in the active layer. The amount of optical absorption and the corresponding heating of the region adjacent to the facet is reduced. With this reduction in local heating, the facet damage will also be reduced.

I claim:

1. A laser comprising:
 a body of semiconductor material having a pair of opposed mirror facets which are reflective of light, at least one of which is partially transmissive of light, said body including:
 a substrate having first and second opposed major surfaces and having a pair of channels, with a mesa therebetween, in said first major surface and extending between said facets;
 a first confinement layer overlying said first major surface and the surface of said channels and said mesa;
 an active region, comprising a guide layer and an adjacent active layer, overlying said first confinement layer, said active layer extending to said facets and having a thinner portion thereof at at least one of said mirror facets which has a non-zero thickness over said mesa which is less than the thickness of a thicker portion of said active layer over the remainder of said mesa;
 a second confinement layer overlying said active region;
 a first electrical contact overlying said second confinement layer; and
 a second electrical contact overlying said second major surface.

2. The laser of claim 1 wherein the height of an end portion of said mesa above the bottom of said channels is greater than the height of a central portion of said mesa above the bottom of said channels.

3. The laser of claim 1 wherein the center-to-center spacing of an end portion of said channels is greater than the center-to-center spacing of a central portion of said channels.

4. The laser of claim 1 wherein the width of an end portion of the channels is greater than the width of a central portion of said channels.

5. The laser of claim 1 wherein said guide layer overlies said first confinement layer and said active layer overlies said guide layer.

6. The laser of claim 5 wherein said thinner portion of said active layer is less than about 0.1 micrometer thick.

7. The laser of claim 6 wherein a capping layer overlies said second confinement layer, an electrically insulating layer overlies said capping layer and has an opening extending therethrough over said mesa and said first electrical contact overlies said electrically insulating layer and said capping layer in said opening.

8. The laser of claim 7 wherein said substrate and capping layer are composed of GaAs and said first confinement layer, said guide layer and said second confinement layer are composed of AlGaAs alloys.

* * * * *